United States Patent [19]

Palac

[11] Patent Number: 4,695,523

[45] Date of Patent: Sep. 22, 1987

[54] METHOD OF SCREENING A FLAT MASK CATHODE RAY TUBE

[75] Inventor: Kazimir Palac, Carpentersville, Ill.

[73] Assignee: Zenith Electonics Corporation, Glenview, Ill.

[21] Appl. No.: 727,486

[22] Filed: Apr. 26, 1985

[51] Int. Cl.⁴ ............................. G03C 5/00; H01J 9/20
[52] U.S. Cl. ......................................... 430/23; 430/24; 430/25; 313/405; 313/407
[58] Field of Search .................... 430/23, 24, 5, 6, 25; 313/405, 407

[56] References Cited

U.S. PATENT DOCUMENTS

| | | | |
|---|---|---|---|
| 2,625,734 | 1/1953 | Law | 29/25.13 |
| 3,399,319 | 8/1968 | Schwartz et al. | 313/405 |
| 3,894,321 | 7/1975 | Moore | 29/25.15 |
| 3,975,198 | 8/1976 | Palac et al. | 430/6 |
| 4,069,567 | 1/1978 | Schwartz | 29/25.15 |
| 4,315,189 | 2/1982 | Goto et al. | 313/405 |
| 4,547,696 | 10/1985 | Strauss | 427/68 |

*Primary Examiner*—Charles L. Bowers, Jr.
*Attorney, Agent, or Firm*—Cornelius J. O'Connor

[57] ABSTRACT

A method of screening a tensed mask CRT faceplate to correct for color purity errors resulting from screening of the tube through a tension mask whose supporting frame is distorted by the tensile forces exerted by the mask on the frame. The method includes heating the tensed mask during photoscreening of the tube to a temperature sufficient to substantially reduce the strain imparted to the support frame.

9 Claims, 4 Drawing Figures

METHOD OF SCREENING A FLAT MASK CATHODE RAY TUBE

CROSS-REFERENCE TO RELATED APPLICATIONS

This application is related to but in no way dependent upon copending applications Ser. Nos. 538,001 and 538,003 both filed Sept. 30, 1983; Ser. Nos. 572,088 and 572,089 both filed Jan. 18, 1984; and Ser. Nos. 646,861 and 646,862, both filed Aug. 31, 1984, all of common ownership herewith.

BACKGROUND OF THE INVENTION AND PRIOR ART

This invention relates generally to the manufacture of a tensed mask cathode ray tube (CRT) and particularly to means for photoscreening the faceplate thereof through the tensed mask. Conventional color CRTs have a generally spherical shadow mask for shadowing a phosphor target or screen consisting of a regular pattern of photo-deposited triads of red, green and blue light-emitting phosphors from its corresponding electron-beam-emitting source located in the neck of the CRT. The foraminous shadow mask is used in forming the phosphor screen, and it must be repeatedly and precisely repositioned, with respect to the CRT faceplate, during screen forming. In most such CRTs, the shadow mask is supported on a relatively heavy frame that is capable of self-maintaining its configuration since the mask is not under tension. During fabrication of the screen, the shadow mask is repeatedly positioned in registration with the CRT faceplate by recourse to a plurality of stud-engaging flat springs that are attached to the shadow mask frame.

This invention concerns a tensed mask CRT. The tensed mask comprises a thin foil having a pattern of apertures. The mask is held under tension in position adjacent to a flat faceplate upon which the phosphor screen is formed. Since the foil mask is extremely thin, etching of the apertures can be precisely controlled, thus providing a CRT of much higher resolution. The foil is under significant tension, close to the yield point of the steel material generally used. It thus may be heated to a very high temperature before the tension is relieved and mask distortion sets in. The electron energy that a tensed foil mask can absorb without significant degradation in color purity is much greater than for a conventional spherical shadow mask tube. Consequently a much brighter and sharper image can be produced with a tensed mask CRT.

An inherent problem in a tensed mask CRT is that the mask support frame must be capable of withstanding the relatively high tensile forces exerted by the tensed shadow mask thereon without substantial deformation. One mask-supporting technique involves attaching the mask at its periphery to a glass or ceramic support frame by means of a devitrifiable glass or "frit". The mask is typically composed of a steel having a coefficient of thermal expansion that is significantly higher than that of glass. The mask is joined to its support frame under modest tension with a bead of devitrifiable frit in place and heated to the melting temperature of the frit. The steel mask expands at a much greater rate than the glass support frame. When the frit melts and the structure is subsequently cooled, the frit solidifies at a temperature at which the mask is still expanded, and firmly bonds the periphery of the mask to the glass support frame. As the solidifying temperature for the frit is sufficiently high, the steel mask is still enlarged relative to the support frame. Further cooling of the structure results in the mask being prevented from returning to its original size by virtue of its having been bonded to the support frame by the solidified frit. The mask is thus subjected to a large tension force. This high tension force is imparted to the glass support frame, and since the frame is not infinitely stiff, it deflects somewhat. This deflection is greater along the long sides of the frame than along the short sides. As a result the frame imparts a displacement of the aperture pattern from the position the pattern occupied before the frame cools down.

In accordance with conventional techniques for forming phosphor screens on the panels of color CRTs, the shadow mask is used as a stenciling element. It is therefore repeatedly positioned in accurate registration with the panel, and with respect to exposure light sources that simulate the electron beams emitted by the electron guns in the CRTs. It will be appreciated that any deformation in the mask support frame will establish the mask apertures in a distorted pattern. Thereafter, subsequent to the screening process, the phosphor screen formed on the panel will reflect a corresponding distortion.

In accordance with the referenced copending applications, the tensed mask support frame ultimately becomes a structural element of the completed CRT envelope. During a final manufacturing step, the CRT panel, support frame and funnel are subjected to an elevated temperature with devitrifiable frit being applied on corresponding mating surfaces. The frit devitrifies, and when it has solidified, it provides a unified glass structure that is hermetically sealed. Since the tensed mask is heated during the assembly process, it expands more than the support frame, and most of the tension in the mask is relaxed, thus substantially removing the deformation forces acting on the support frame. As the frit solidifies (during tube cool-down), the support frame is bonded between the faceplate and funnel of the CRT. On cooling of the tube, tension forces are again built up in the mask. However, these forces do not result in deformation of the support frame because the frame is now firmly bonded to the faceplate and funnel. Thus the aperture pattern in the mask of the finished CRT is slightly expanded and different from the aperture pattern in the mask during screening due to the tension-induced distortion of the mask's support frame during the screeing step. Thus color purity errors are apt to result. This invention is directed to elimination of the distortion of the support frame, and the attendant corresponding distortion of the mask aperture pattern, manifested during screening operations prior to the advent of the subject invention.

An early example of a tensed shadow mask for use in a color television cathode ray tube is described in U.S. Pat. No. 2,625,734. The tensed mask described therein was created by resort to a process called "hot-blocking". The practice was to insert a flat mask between a pair of frames which loosely received the mask. A series of tapped screws joining the two frames served to captivate the mask when the screws were subsequently drawn-down. The loosely assembled frame and mask was then subjected to a heat cycle by positioning heated platens adjacent the mask to heat and thereby expand it. The frame, however, was kept at room temperature. When the mask attained a desired expansion, the frame screws were tightened to captivate the mask in its expanded state. The heating platens were then removed. Upon cooling down to room temperature, the mask was maintained under tension by the frame. The resultant assembly was then mounted inside the tube adjacent the phosphor screen.

U.S. Pat. No. 4,069,567 describes a method for tensing a mask in which the mask is heated while the tension by passing an electrical current through it. Alternately, RF (radio frequency) heating is proposed. The metal of the mask has a greater coefficient of expansion than the structural frame that supports it, hence upon cooling, and upon captivation of the mask relative to the frame, the mask is held in a tensed state.

A method for processing color cathode ray tubes having a color selection electrode consisting of a thin metal foil with a pattern of electron-transmissive apertures formed therein is disclosed by Moore in U.S. Pat. No. 3,894,321, of common ownership herewith. The foil is stretched across the bulb of the tube and sealed directed thereto. According to this invention, such a tube may be exposed and screened without the necessity of resorting to a processing system which dictates the use of interchangeable masks. A lighthouse assembly for screening tubes having foil shadow masks is described and shown.

OBJECTS OF THE INVENTION

The principal object of this invention is to provide an improved method of screening a tensed mask CRT faceplate.

Another object of this invention is to provide a method of manufacturing a tensed mask CRT having improved color purity.

A further object of this invention is to provide an improved tensed mask CRT screening method which permits use of a relatively lightweight support frame for the mask.

BRIEF DESCRIPTION OF THE DRAWINGS

Further objects and advantages of the invention will be apparent upon reading the following description in conjunction with the drawings in which.

DESCRIPTION OF THE PREFERRED EMBODIMENT

Figure 1:
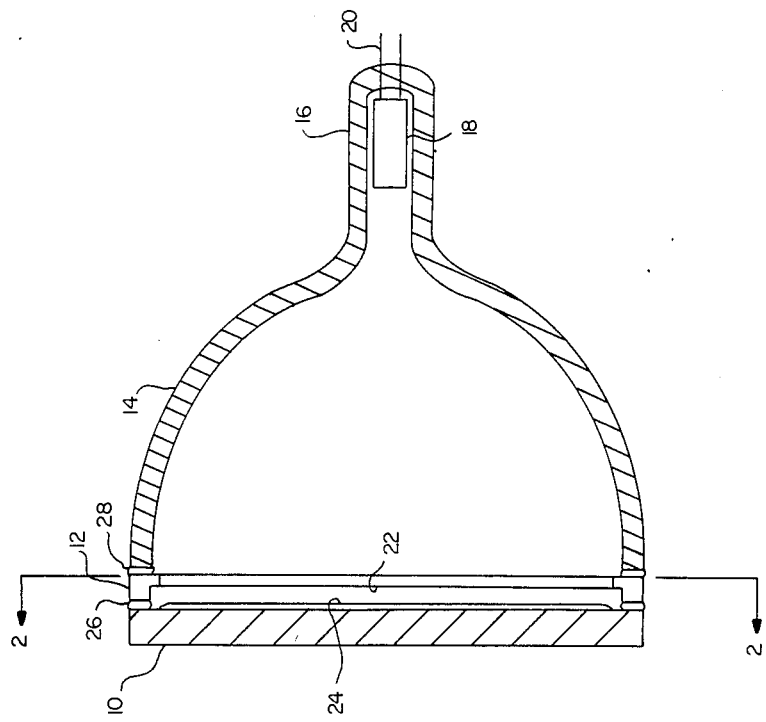
FIG. 1 represents a simplified cross-section of a tensed mask CRT.

Referring to FIG. 1, a tensed mask CRT includes a flat glass panel or faceplate 10, a glass support frame 12 and a bell-shaped funnel 14 that extends into a small diameter cylindrical neck 16 for housing an electron gun 18 of conventional form. The inner surface of panel 10 has formed thereon, by conventional photodeposition techniques, a target or screen 24 consisting of a regular pattern of triads of red, green and blue light-emitting phosphors which matches the pattern of apertures in a confronting flat shadow mask 22 that is maintained under tension. The glass elements of the CRT are joined together by devitrifiable frit at junctions 26 and 28. A plurality of pins 20 enable electrical and signal potentials to be introduced to electron gun 18. It will be recognized that other elements of the CRT such as the high voltage anode and its connection are eliminated for the purposes of clarity of illustration.

Figure 2:
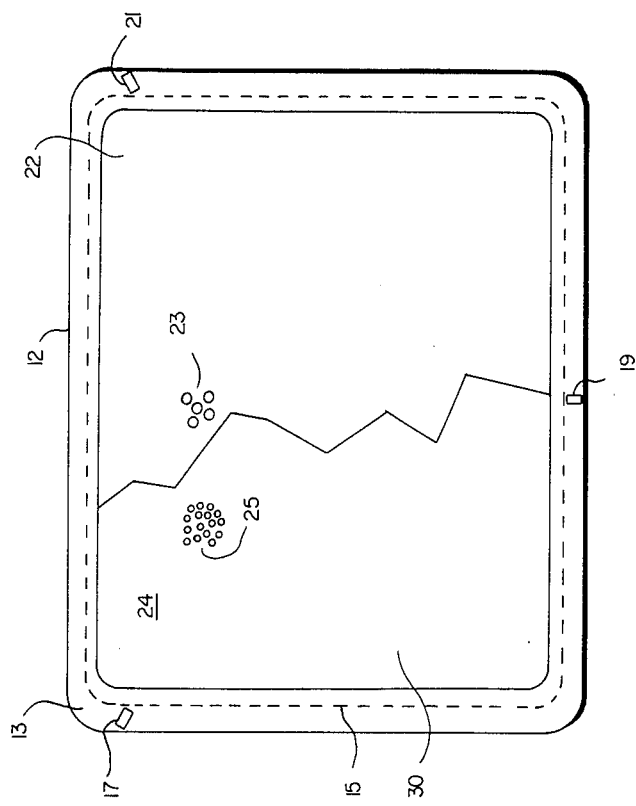
FIG. 2 is a cross-sectional view taken along the lines 2—2 of FIG. 1 showing the tensed mask partially broken away to reveal the screen structure.

In FIG. 2, the rear of mask support frame 12 is illustrated in conjunction with tensed mask 22 which includes a plurality of apertures 23, only a few of which are illustrated. Mask 22 is positioned in confronting relationship to phosphor screen 24 on the inner surface of flat panel 10. Screen 24 consists of a plurality of triads of light-emitting phosphor deposits 25, only a few of which are illustrated, formed by photodeposition with tensed mask 22 being used as a stenciling element. As is conventional in many color CRTs, a background of inert, light-absorptive material is deposited in the interstices between the phosphor deposits for contrast enhancement and brightness improvement. In a very popular type of color CRT, one commonly referred to as a "negative guard band" tube, a black surround or grille 30 of black inert material is initially deposited on the CRT faceplate by multiple exposures with the shadow mask as a stenciling element to form a plurality of transparent areas for reception of appropriate ones of the color light-emitting phosphors. By a well-known controlled photodeposition technique, the apertures in the grille formed on the faceplate may be made smaller than the corresponding apertures in the tensed mask, thus permitting the grille to provide a guard band, or margin, that enables the color phosphor deposits to be fully illuminated by the corresponding electron beams without the beams overlapping onto other deposits and causing color impurity. The purity of the screen is maintained under maximum brightness and the grille provides contrast enhancement. These techniques are well-known in the art and as a result, need not be described in detail.

Support frame 12 includes a plurality of registration grooves 17, 19 and 21 that are substantially radially disposed about its periphery. Frame 12 also includes an inner recessed shelf 15 (seen in dashed lines) to which the periphery of tensed mask 22 is attached, preferably by a bead of frit.

Figure 3:
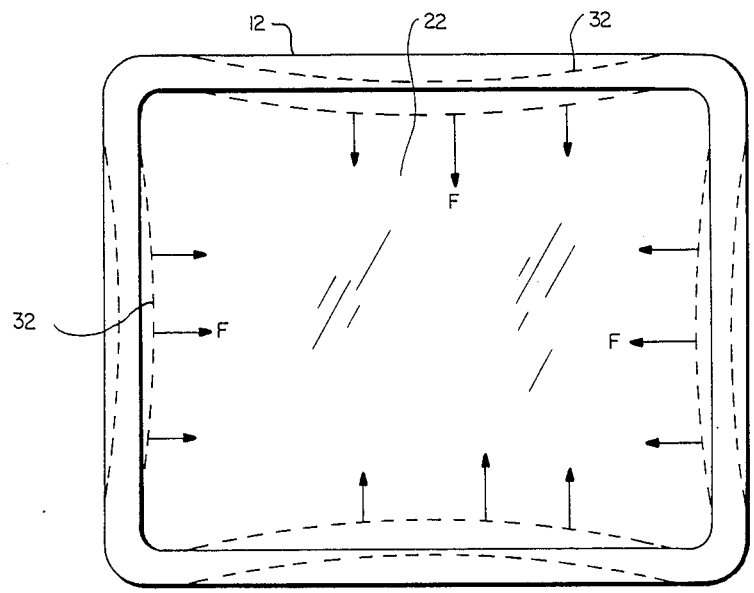
FIG. 3 is a schematic representation of the mask-frame assembly illustrating, in exaggerated form, the distortion of the frame caused by tension in the tensed mask.

In FIG. 3, support frame 12 is shown in an unstressed state by the solid lines and in an exaggerated distorted form by dashed lines 32. The tensioning of mask 22 exerts forces inwardly on the frame periphery, as indicated by the arrows labelled F, which forces result in "dog-boning", or inward deflection of the frame. In a practical tensed mask tube, the mask may be made of cold-rolled steel with the tension therein being about 30,000 psi—just below the material yield point. If the mask is subsequently heated to about 60 degrees C. above room temperature, substantially all of the tension forces are relaxed and any distortions caused thereby in the supporting frame are removed. Thus the support frame may be returned to its original, undistorted form while maintaining the tensed mask slightly taut and undistorted. Since, as explained above, the frame is in an undistorted state in the finished CRT, accordingly, one aspect of the invention involves relaxing the tension in the tensed mask during screening operations to insure that the apertures formed in the grille and/or the phosphor deposits will occupy their proper respective positions on the faceplate. With this invention, the electron beams in the finished CRT need not be corrected to compensate for distortion attributable to the differences between the pattern of apertures in the mask during screening, and the pattern of apertures in the mask in the finished tube.

Figure 4:
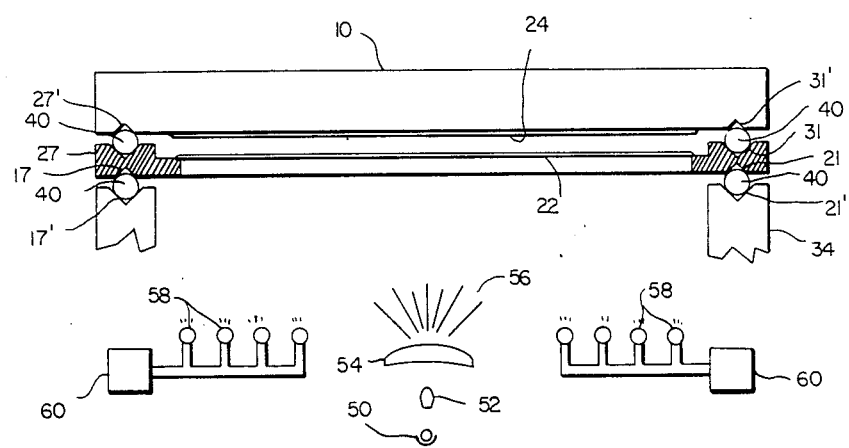
FIG. 4 is a partial cross-section of a screening station for performing the method of the invention.

Referring to FIG. 4, which illustrates a partial cross-section of a screening station, or lighthouse as it is conventionally referred to, panel 10 is supported on support frame 12 which, in turn, is supported on lighthouse support walls 34 by a ball-and-groove registration arrangement to assure positioning repeatability between these elements. Specifically, frame 12 has grooves 17 and 21 shown in a confronting relationship with oppositely disposed grooves 17' and 21' in the walls 34 of the lighthouse. Each respective set of grooves is separated by a spherical member 40. At the panel-facing surface of frame 12, a similar pair of grooves 27 and 31 in frame 12 cooperate with a pair of spherical members 40 which members are also received by confronting panel grooves 27' and 31' to support panel 10 in proper registration. It will be understood that a third set of grooves and spherical members (not visible in this view) are provided for repeatable registration. With the registration system, target 24 on the inner surface of panel 10 is supported in a precise relationship to tensed mask 22.

A source of energy 50 actinic to the photosensitive screening coatings is disposed below a light collimating tip 52 which collects and concentrates the energy from source 50. The energy is supplied to a lens 54 which floods the surface of mask 22 with appropriately directed rays 56 of actinic energy. This photodeposition technique is well-known with differently located sources of actinic energy being used to simulate the different positions of the electron beam-forming guns in the neck of the CRT for exposing the target through the apertures of the tensed mask. A similar arrangement is used to form the grille of black material on the faceplate of the panel prior to deposition of the phosphor elements.

In accordance with the invention, a plurality of infrared light sources 58 are supplied by power sources 60 for illuminating tensed mask 22 with infrared energy. The infrared energy from sources 58 must be sufficient to elevate the temperature of tensed mask 22 by approximately 60 degrees C. over the lighthouse ambient temperature. With the tension in mask 22 substantially, but not totally relieved, support frame 12 is caused to revert to its substantially undistorted form during the exposure process. The infrared energy is not actinic to (does not affect) the photosensitized coatings on panel 10 which responds only to the actinic energy from source 50. This technique is used during screening of the grille, if one is incorporated. It may also be used during screening of the individual color phosphors regardless of whether or not a grille is employed on the faceplate. Since, during screening, the reduced tensioned mask does not distort the support frame, the pattern of apertures formed on the CRT faceplate corresponds to the aperture pattern in the tensed mask in the completed tube. A possible benefit lies in the fact that, because of the guard band provided by the grille, it may not be necessary to screen the phosphor deposits with the tensed mask relieved of tension.

While infrared heating is illustrated, other forms of tension-relief of the mask by heating may also be used such as rf induction. Because of the relatively short exposure times in the lighthouse (on the order of one or two minutes), the heating of the tensed mask may be sufficiently localized to preclude any adverse effects upon the photosensitive surface of the panel despite the use of other forms of energy.

It is recognized that other changes in the described invention will be apparent to those skilled in the art without departing from its true spirit and scope. The invention is to be limited only as defined in the claims.

What is claimed is:

1. For use in the manufacture of a color cathode ray tube which ultimately includes a tensed mask having a pattern of apertures, a method of photographically forming a pattern related to said pattern of apertures on a faceplate of said tube which method includes utilizing said tensed mask, said mask being held on a support frame that is subject to distortion when in a free state by forces exerted thereon by said tensed mask, the method comprising:
    positioning said faceplate bearing a photosensitive coating in an exposure station and in registration with said mask support frame;
    thermally expanding said tensed mask to reduce tension in said tensed mask and thereby reduce distortion in said support frame; and
    exposing said faceplate borne photosensitive coating through said tensed mask, to energy actinic to said coating while said support frame is in its distortion-reduced state to thereby create a substantially undistorted latent image of said aperture pattern on said coating.

2. The method of claim 1 wherein the step of reducing tension in the mask comprises heating the tensed mask to a temperature at which the tension therein is substantially, but not totally, relieved.

3. The method of claim 2 wherein said heating step is performed by exposure of the tensed mask to infrared energy.

4. The method of claim 2 wherein said heating step is performed by subjecting the tensed mask to rf induction.

5. The method of claim 3 where in said photographically formed pattern on said coating comprises a grille of light-absorbing material bearing apertures corresponding to the apertures in said tensed mask.

6. For use in the manufacture of a color cathode ray tube which ultimately includes a tensed mask having a pattern of apertures, a method of forming a grille of light-abosorbent material on a flat faceplate wherein said tensed mask is held on a support frame subject to distortion, when in a free state, attributable to the tension in said tensed mask, said distortion being substantially removed upon assembly of said frame in the finished CRT, the method comprising:
    positioning a flat faceplate bearing a photosensitive coating in an exposure station and in registration with said mask support frame and said tensed mask;
    substantially relieving the tension in said tensed mask by heating said tensed mask and thereby substantially removing the distortion induced in said support frame;
    exposing said faceplate borne photosensitive coating through said tension-relieved mask to energy actinic to said coating while said support frame is in a substantially undistorted state to thereby create a latent image of said aperture pattern, on said coating;
    and developing said latent image to form a grille of light absorbent material having an aperture pattern substantially corresponding to the aperture pattern of said tensed mask when said tube is finally assembled and operating.

7. The method of claim 6 wherein said heating step is performed by flooding the tensed mask with infrared energy.

8. The method of claim 7 further comprising repeating the method with exposure sources arranged in different positions to simulate the locations of the different electron beams in the finished CRT.

9. The method of claim 8 further comprising repeating the method with photosensitive surfaces bearing different color light-emitting phosphors whereby phosphor deposits are positioned in overlying relationship to corresponding apertures formed in the grille.

* * * * *